(12) United States Patent
Harm

(10) Patent No.: US 7,952,448 B2
(45) Date of Patent: May 31, 2011

(54) DEVICE COMPRISING AN ELEMENT WITH ELECTRODES COUPLED TO CONNECTIONS

(75) Inventor: Lex Harm, Nijmegen (NL)

(73) Assignee: NXP B.V., Eindhoven (NL)

( * ) Notice: Subject to any disclaimer, the term of this patent is extended or adjusted under 35 U.S.C. 154(b) by 502 days.

(21) Appl. No.: 12/090,696

(22) PCT Filed: Oct. 10, 2006

(86) PCT No.: PCT/IB2006/053719
§ 371 (c)(1),
(2), (4) Date: Apr. 24, 2008

(87) PCT Pub. No.: WO2007/046031
PCT Pub. Date: Apr. 26, 2007

(65) Prior Publication Data
US 2008/0278241 A1    Nov. 13, 2008

(30) Foreign Application Priority Data
Oct. 19, 2005 (EP) .................................... 05109748

(51) Int. Cl.
*H01P 5/02* (2006.01)
*H03H 7/38* (2006.01)
(52) U.S. Cl. ........................................................ 333/32

(58) Field of Classification Search ............... 333/32–25, 333/124, 17.3; 257/584, 587; 330/67, 66, 330/302
See application file for complete search history.

(56) References Cited

U.S. PATENT DOCUMENTS

| | | | |
|---|---|---|---|
| 5,315,156 A * | 5/1994 | Lott | ............... 257/728 |
| 5,635,751 A | 6/1997 | Ikeda et al. | |
| 6,365,918 B1 | 4/2002 | Litwin et al. | |
| 2001/0050421 A1 | 12/2001 | Kono | |
| 2005/0083118 A1 | 4/2005 | Bakker | |

FOREIGN PATENT DOCUMENTS

| | | |
|---|---|---|
| EP | 0971411 A2 | 1/2000 |
| JP | 2000-077954 A | 3/2000 |

* cited by examiner

*Primary Examiner* — Benny Lee
*Assistant Examiner* — Gerald Stevens

(57) ABSTRACT

An adaptive cruise control system and a method for controlling the speed of a vehicle are disclosed. The system generally includes a controller which determines a torque instruction associated with a limit speed of the vehicle which is less than a selected speed. The method generally includes determining a distance between the vehicle and an object detected in the path of the vehicle, determining a torque instruction which is associated with a limit speed which is less than a selected speed from at least the distance, and transmitting the torque instruction to an engine controller of the vehicle.

9 Claims, 3 Drawing Sheets

DEVICE COMPRISING AN ELEMENT WITH ELECTRODES COUPLED TO CONNECTIONS

Figure 1:
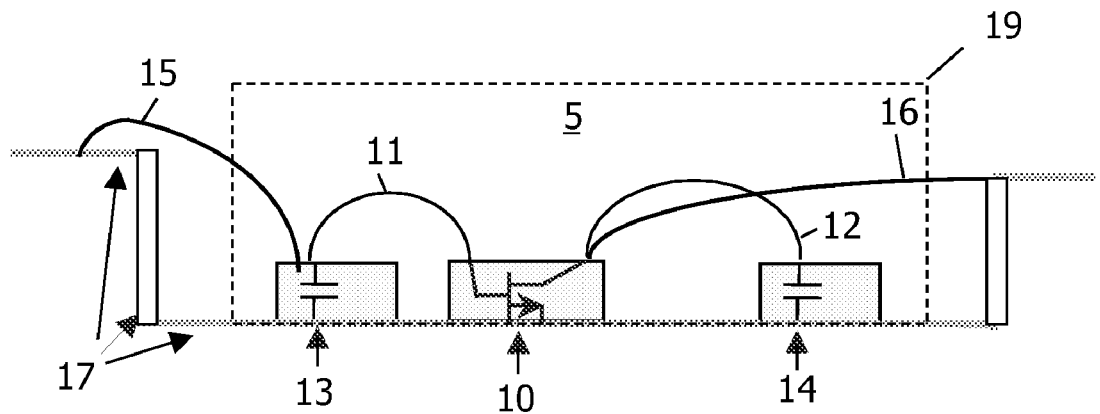

The invention relates to a device comprising an element with a first electrode coupled to a first connection and with a second electrode coupled to a second connection, and also relates to an element, and to a method.

Examples of such a device are cellular base stations and consumer products and substrates, each comprising an element in the form of for example an amplifier or a transistor or a package or a die.

A prior art device is known from US 2005/0083118 A1, which discloses a radio frequency amplifier device comprising an amplifier element. Such an amplifier element, as disclosed in paragraph 0006 of US 2005/0083118 A1, features an internal shunt inductor at its output to compensate an output capacitance. An input (first electrode) of the amplifier element is coupled to a matching capacitor via a bond wire (first connection). The internal shunt inductor is formed by a further bond wire (second connection) coupled to the output (second electrode) of the amplifier element and further coupled to a further matching capacitor.

The known device is disadvantageous, inter alia, owing to the fact that between the first and second connections an electromagnetic coupling may be present. Such an electromagnetic coupling may introduce an unwanted feedback and may deteriorate a transfer characteristic of the element.

It is an object of the invention, inter alia, to provide a device having a reduced electromagnetic coupling between the first and second connections.

Further objects of the invention are, inter alia, to provide an element and a method having a reduced electromagnetic coupling between the first and second connections.

The device according to the invention comprises an element with a first electrode coupled to a first connection and with a second electrode coupled to a second connection, at least one of the first and second connections forming part of an impedance transforming network, a largest part of the first connection forming part of a first plane and a largest part of the second connection forming part of a second plane, which first and second planes are non-parallel planes for reducing an electromagnetic coupling between the first connection and the second connection.

By locating a largest part of the first connection in a first plane and by locating a largest part of the second connection in a second plane, which first and second planes are non-parallel planes, an electromagnetic coupling between the first connection and the second connection is reduced. An electromagnetic coupling between two connections is a wireless coupling for converting a first current flowing through a first connection into a magnetic field and for converting this magnetic field into a second current flowing through a second connection.

The device according to the invention is further advantageous, inter alia, in that an unwanted feedback and a deterioration of a transfer characteristic of the element are reduced, and in that a use of different non-parallel planes for the different connections allows the different electrodes of the element to be located closer to each other resulting in a reduced size and allows the different electrodes of the element to be located at one and the same side of the element, without excluding a possibility that they are located at different sides of the element.

Each one of the connections may be a bond wire or an other wire coupled to a die or a substrate or may be a conductor integrated via a die or a substrate. A largest part of a connection comprises at least 50% and at most 100% of the connection. A largest part of a connection comprising less than 100% of the connection may comprise two or more sub-parts that are linked via a further sub-part not forming part of the largest part of the connection. A largest part of a connection is located in a plane at least in an average way, preferably in an entire way.

An embodiment of the device according to the invention is defined by the largest part of the first connection not forming part of the second plane and the largest part of the second connection not forming part of the first plane. So, preferably, the largest parts of the connections do not form part of each other's plane, in other words these largest parts of the connections do not form part of one another's plane.

An embodiment of the device according to the invention is defined by the largest part of the first connection and the largest part of the second connection not forming part of one and the same plane. So, preferably, the largest parts of the connections do not form part of a same plane.

An embodiment of the device according to the invention is defined by the first and second planes making an angle between 45 degrees and 135 degrees. An angle between the first plane and the second plane forms a parameter for reducing an electromagnetic coupling between the first connection and the second connection. Preferably, the angle between the first plane and the second plane will be between 80 degrees and 100 degrees, such as for example 90 degrees.

An embodiment of the device according to the invention is defined by at least one of the first and second connections having a shape for further reducing the electromagnetic coupling between the first connection and the second connection. The shape of at least one of the first and second connections also forms a parameter for reducing an electromagnetic coupling between the first connection and the second connection.

An embodiment of the device according to the invention is defined by the shape of the at least one of the first and second connections being a part of a loop. A current flowing through a connection results in an electromagnetic field, according to a right hand rule. This electromagnetic field, according to the right hand rule, does not result in a further current or results in a reduced further current flowing through a further connection that is substantially perpendicular to a plane of the loop.

An embodiment of the device according to the invention is defined by the at least one of the first and second connections that forms part of the impedance transforming network comprising an inductance and the element at the electrode coupled to this at least one of the first and second connections comprising an element-internal capacitance, the impedance transforming network transforming an element-internal resistance at this electrode. This way, for example an output resistance of the element can be increased by at least a factor two such as for example a factor five to twenty. Preferably, both latter embodiments are combined, whereby a shape of a connection in a form of a loop increases a length of this connection, and whereby an increased length of a connection results in an increased range of possible inductance values for this connection.

An embodiment of the device according to the invention is defined by at least one of the first and second connections further being coupled to an element-external capacitor. Such an element-external capacitor is for example a matching capacitor. Preferably, each connection is coupled to its own matching capacitor. The invention allows the element and one or both matching capacitors together to be integrated via a small and therefore low cost die and to be packaged via one small and therefore low cost package. This is of great importance.

An embodiment of the device according to the invention is defined by the element being a radio frequency amplifier, the first electrode being an input and the second electrode being an output. Especially in a (high) radio frequency environment, the invention is advantageous (>100 MHz).

An embodiment of the device according to the invention is defined by the element being a transistor, the first electrode being a control electrode and the second electrode being a main electrode. Especially in a (small) transistor environment, the invention is advantageous, further especially in a power transistor environment (>0.1 Watt).

Embodiments of the element according to the invention and of the method according to the invention correspond with the embodiments of the device according to the invention. The element according to the invention may be produced and/or sold separately from a rest of the device according to the invention.

The invention is based upon an insight, inter alia, that a current flowing through a connection results in a magnetic field that results in a further current flowing through a further connection, which further current depends on a distance between the connections and depends on an angle between the connections, and is based upon a basic idea, inter alia, that largest parts of the connections should form part of non-parallel planes to reduce an electromagnetic coupling between the connections.

The invention solves the problem, inter alia, to provide a device having a reduced electromagnetic coupling between the first and second connections, and is further advantageous, inter alia, in that an unwanted feedback and a deterioration of a transfer characteristic of the element are reduced, and in that a use of different non-parallel planes for the different connections allows the different electrodes of the element to be located closer to each other resulting in a reduced size and allows the different electrodes of the element to be located at one and the same side of the element.

These and other aspects of the invention will be apparent from and elucidated with reference to the embodiments(s) described hereinafter.

Figure 2:
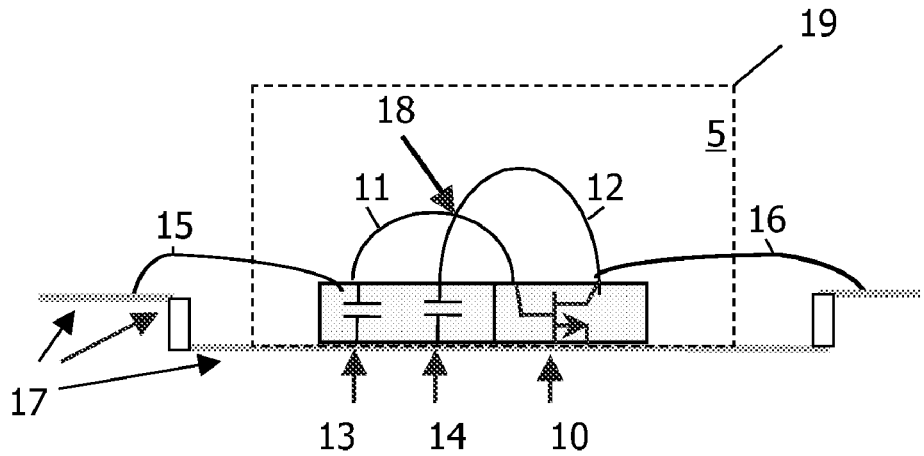
Figure 3:
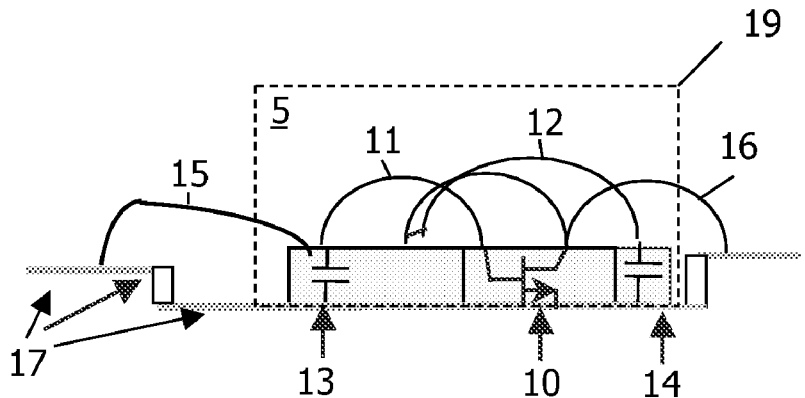
Figure 4:
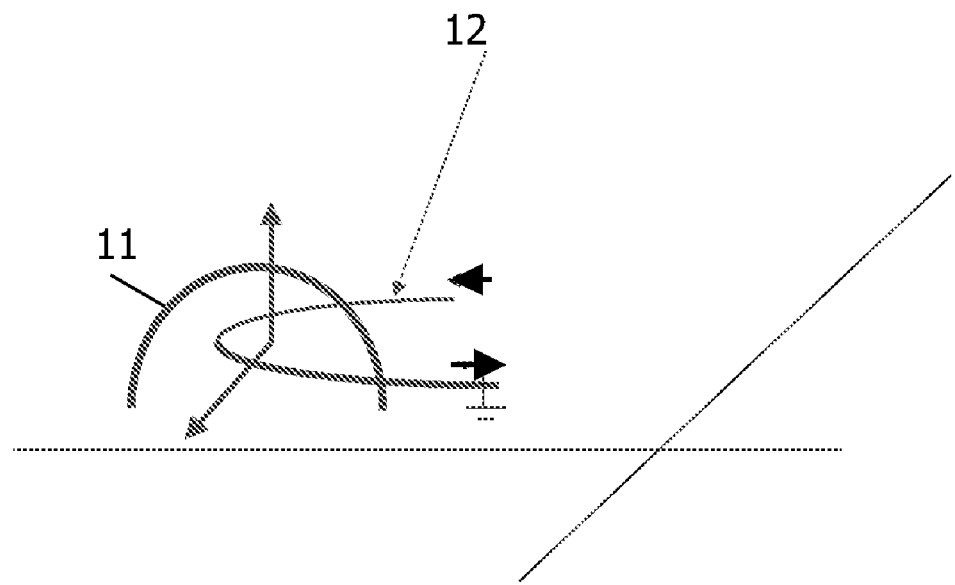
Figure 5:
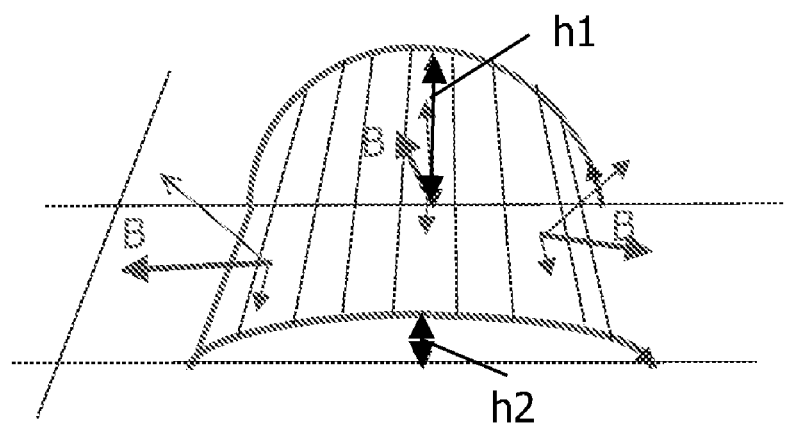
Figure 6:
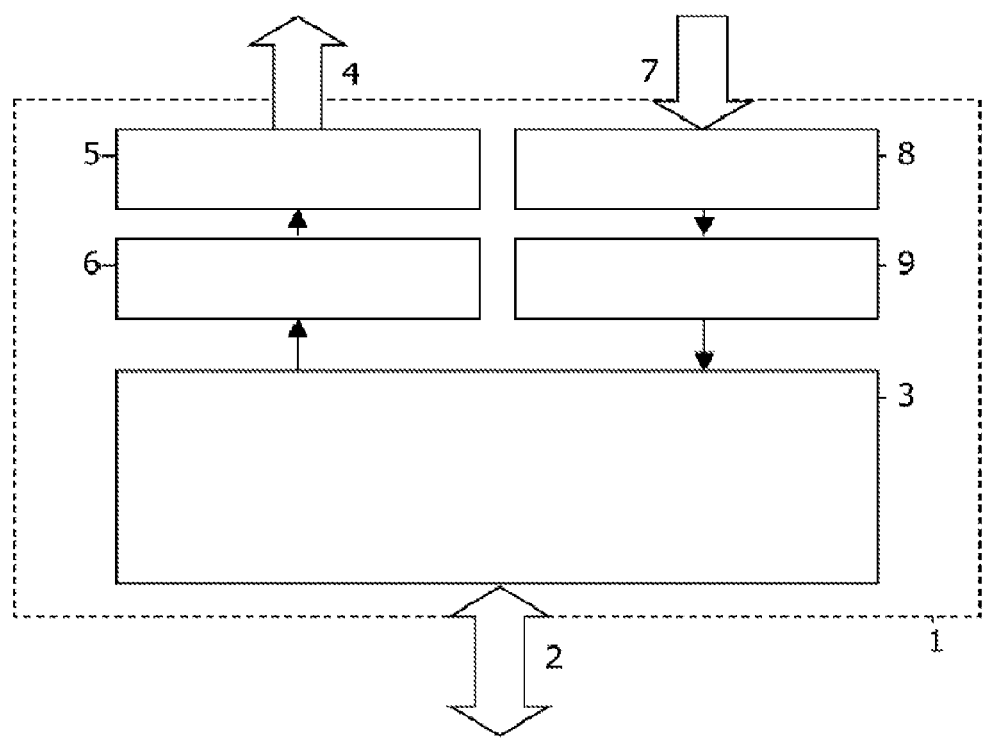

In the drawings:

FIG. 1 shows an embodiment of a prior art element comprising a single basic package, FIG. 2 shows an embodiment of an element comprising one smaller package resulting in larger electromagnetic coupling problems, FIG. 3 shows an embodiment of an element according to the invention comprising one smaller plastic package and connections in non-parallel planes with one of the connections comprising a loop resulting in smaller electromagnetic coupling problems, FIG. 4 shows a principle of different connections located in different planes according to the invention, FIG. 5 shows a principle of a connection being in the form of a part of a loop according to the invention, FIG. 6 shows diagrammatically a device according to the invention comprising an element according to the invention, and The prior art element 5 shown in FIG. 1 comprises a transistor 10, a first external capacitor 13 coupled via a first connection 11 to a first electrode (gate) of the transistor 10 and a second external capacitor 14 coupled via a second connection 12 to a second electrode (drain or source) of the transistor 10, all located on a horizontal conducting bottom of a substrate 17 that further comprises two vertical non-conducting sides and two horizontal conducting tops. The first and second capacitors 13 and 14 are matching capacitors further coupled to the substrate 17. At the first capacitor 13, the first connection 11 also called gate wire is further coupled to a further gate wire 15. The drain of the transistor 10 is further coupled to a drain wire 16. The second connection is also called internal shunt inductor wire or inshin wire. The transistor 10, the first external capacitor 13 and the second external capacitor 14 are packaged in a single basic package 19. This single basic package 19 comprises three dies (one for the transistor 10 and one for each external capacitor 13 and 14) and is relatively large, which makes the prior art element 5 relatively expensive.

The element 5 shown in FIG. 2 corresponds with the one shown in FIG. 1, apart from the fact that now the transistor 10, the first external capacitor 13 and the second external capacitor 14 are together packaged in one smaller package 19. This has become possible owing to the fact that both external capacitors 13 and 14 are now located at one side of the transistor 10 and is relatively low cost compared to a larger package and requires a relatively small die, which is also relatively low cost.

Preferably the transistor 10 such as a LDMOST and the external capacitors 13 and 14 are to be integrated on a single piece of silicon for yet another reason. In cheaper packages such as plastic ones, only one piece of silicon can be soldered, due to technological limitations of the die soldering process for these cheaper packages. The embodiment of FIG. 1 has three separate pieces of silicon, which do not allow the embodiment to be packaged in a cheap plastic package. The embodiment of FIG. 1 can only be packaged in an expensive ceramic package.

Unfortunately, contrary to the element 5 shown in FIG. 1, the element 5 shown in FIG. 2 will show larger electromagnetic coupling problems, owing to the fact that a relatively large electromagnetic coupling 18 will be present between the first connection 11 and the second connection 12.

The element 5 shown in FIG. 3 corresponds with the one shown in FIG. 1, whereby now a relatively small die is used, owing to the fact that the second external capacitor 14 is located closer to the transistor 10, without both external capacitors 13 and 14 being located at one side of the transistor 10. This has become possible, because the second connection 12 forms a part of a loop that either at least partly surrounds the first connection 11 or that does not surround the first connection 11. At the same time, largest parts of the first and second connections 11 and 12 are located in non-parallel planes, as shown in greater detail in FIG. 4.

FIG. 4 shows a principle of the different connections 11 and 12 located in different planes according to the invention. The magnetic field created by the second connection 12 is rotated by 90 degrees compared to a conventional situation. And because the shape of the first connection 11 remains the same, the magnetic fields of the first and second connections 11 and 12 become in an ideal situation orthogonal and the electromagnetic coupling between the first and second connections 11 and 12 will then become zero. The first connection 11 does not need necessarily to pass through the loop backed second connection 12, the first connection 11 may also lie beside the loop backed second connection 12. Further, the effective self-inductance of the second connection 12 increases because the second connection is longer and spans an area in between a forward part and a return part of the second connection 12 instead of an area between the second connection 12 and a ground plane.

FIG. 5 shows a principle of a connection being in the form of a part of a loop according to the invention, whereby a first part of a loop has a height h1 and a second part of the loop has a height h2. In case these heights are not equal, a magnetic field B generated via this connection is rotated and as a result an electromagnetic coupling between the connections will increase. This is for example done in case this is needed.

The device 1 according to the invention shown in FIG. 6 comprises a base band block 3 coupled to a wired in/output 2 (receiving/transmitting interface). The base band block 3 is further coupled via a mixer/modulator 6 to an element 5 according to the invention such as a radio frequency amplifier (>100 MHz) and/or a power transistor (>0.1 Watt) and/or (a part of) a package and/or (a part of) a die. The base band block 3 is further coupled via a mixer/demodulator 9 to a pre-amplifier 8. The element 5 is further coupled to a wireless output 4 (transmitting antenna) and the pre-amplifier 8 is further coupled to a wireless input 7 (receiving antenna). Examples of such a device 1 are cellular base stations and consumer products, but also (parts of) substrates.

So, according to the invention, a largest part of the first connection 11 is located in a first plane and a largest part of the second connection 12 is located in a second plane, which first and second planes are non-parallel planes, to reduce an electromagnetic coupling between the first connection 11 and the second connection 12. Each one of the connections 11 and 12 may be a bond wire or an other wire coupled to a die or a substrate or may be a conductor integrated via a die or a substrate. A largest part of a connection comprises at least 50% and at most 100% of the connection.

Preferably, the largest part of the first connection 11 does not form part of the second plane and the largest part of the second connection 12 does not form part of the first plane. And the largest part of the first connection 11 and the largest part of the second connection 12 do preferably not form part of one and the same plane. The first and second planes should make an angle between 45 degrees and 135 degrees, to minimize an electromagnetic coupling between the first connection 11 and the second connection 12, preferably, the angle between the first plane and the second plane will be between 80 degrees and 100 degrees, such as for example 90 degrees, to further minimize this electromagnetic coupling.

At least one of the first and second connections 11 and 12 may have a shape for further reducing the electromagnetic coupling between the first connection 11 and the second connection 12. The shape of the at least one of the first and second connections 11 and 12 may be a part of a loop. A current flowing through a connection results in an electromagnetic field, according to a right hand rule. This electromagnetic field, according to the right hand rule, does not result in a further current or results in a reduced further current flowing through a further connection that is substantially perpendicular to for example a plane of a loop. A part of a loop comprises one or more curves.

At least one of the first and second connections 11 and 12 that forms part of the impedance transforming network comprises an inductance and the element 5 at the electrode coupled to this at least one of the first and second connections 11 and 12 comprises an element-internal capacitance (such as a parasitic capacitance), whereby the impedance transforming network is used for transforming an element-internal resistance at this electrode. This way, for example an output resistance of the element 5 can be increased by at least a factor two such as for example a factor five to twenty. Preferably, a shape of a connection in a form of a loop increases a length of this connection, and an increased length of a connection results in an increased range of possible inductance values for this connection. Two (or three) impedance transforming networks, one for each electrode of the element 5, are not to be excluded. An impedance transforming network may transform an impedance up or down. Such an impedance may comprise one or more resistors, one or more capacitors and/or one or more inductors. The fact that a connection forms part of an impedance transforming network for example implies that this connection has a predefined shape and/or length and/or location and/or structure and/or compound etc.

The invention is particularly useful for high power, mobile telephone base station amplifiers where the output matching network circuitry must be integrated on the Silicon that also contains the active transistor (for example a LDMOST transistor). Thus the invention is useful for all future integration projects for base station power amplifiers and for a certain class of low cost (plastic) package concepts where, due to technological limitations of the die attach process, only a single piece can be mounted in the package.

The requirements for base stations are generally higher (higher breakdown requirement (30V), larger bandwidth etc.) than the requirements for handsets.

For low power applications the invention can be used also but because the power levels in these applications are lower—and therefore the impedances are higher—the output matching networks for theses applications might not need in(ternal) sh(unt)in(ductor) wires.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A device comprising an element with a first electrode coupled to a first connection and with a second electrode coupled to a second connection, at least one of the first and second connections forming part of an impedance transforming network, a largest part of the first connection forming part of a first plane and a largest part of the second connection forming part of a second plane, the first and second planes are non-parallel planes for reducing an electromagnetic coupling between the first connection and the second connection, a shape of the first connection being a part of a loop, wherein a current flowing through the first connection results in an electromagnetic field, according to a right hand rule, and wherein the electromagnetic field, according to the right hand rule, does not result in a further current or results in a reduced further current flowing through the second connection that is substantially perpendicular to a plane of the loop.

2. The device according to claim 1, the largest part of the first connection not forming part of the second plane and the largest part of the second connection not forming part of the first plane.

3. The device according to claim 1, the largest part of the first connection and the largest part of the second connection not forming part of one and the same plane.

4. The device according to claim 1, the first and second planes making an angle between 45 degrees and 135 degrees.

5. The device according to claim 1, at least one of the first and second connections further being coupled to a matching capacitor.

6. The device according to claim 1, the element being a radio frequency amplifier, the first electrode being an input and the second electrode being an output.

7. The device according to claim 1, the element being a transistor, the first electrode being a control electrode.

8. An element with a first electrode coupled to a first connection and with a second electrode coupled to a second connection, at least one of the first and second connections forming part of an impedance transforming network, a largest part of the first connection forming part of a first plane and a largest part of the second connection forming part of a second plane, the first and second planes are non-parallel planes for reducing an electromagnetic coupling between the first connection and the second connection, a shape of the first connection being a part of a loop, wherein a current flowing through the first connection results in an electromagnetic field, according to a right hand rule, and wherein the electromagnetic field, according to the right hand rule, does not result in a further current or results in a reduced further current flowing through the second connection that is substantially perpendicular to a plane of the loop.

9. A method comprising a first step of coupling an element via a first electrode to a first connection and a second step of coupling the element via a second electrode to a second connection, at least one of the first and second connections forming part of an impedance transforming network, the method further comprising a third step of locating a largest part of the first connection in a first plane and a fourth step of locating a largest part of the second connection in a second plane, the first and second planes are non-parallel planes for reducing an electromagnetic coupling between the first connection and the second connection, a shape of the first connection being a part of a loop, wherein a current flowing through the first connection results in an electromagnetic field, according to a right hand rule, and wherein the electromagnetic field, according to the right hand rule, does not result in a further current or results in a reduced further current flowing through the second connection that is substantially perpendicular to a plane of the loop.

* * * * *